(12) United States Patent
Osaki et al.

(10) Patent No.: US 9,847,232 B1
(45) Date of Patent: Dec. 19, 2017

(54) PATTERN-FORMING METHOD

(71) Applicants: JSR CORPORATION, Tokyo (JP);
International Business Machines Corporation, Armonk, NY (US)

(72) Inventors: Hitoshi Osaki, Sunnyvale, CA (US);
Kristin Schmidt, San Jose, CA (US);
Chi-Chun Liu, Albany, NY (US)

(73) Assignees: JSR CORPORATION, Tokyo (JP);
International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/468,772

(22) Filed: Mar. 24, 2017

(51) Int. Cl.
| | |
|---|---|
| H01L 21/311 | (2006.01) |
| G03F 7/11 | (2006.01) |
| G03F 7/039 | (2006.01) |
| G03F 7/16 | (2006.01) |
| G03F 7/20 | (2006.01) |
| G03F 7/32 | (2006.01) |
| H01L 21/768 | (2006.01) |

(52) U.S. Cl.
CPC ........ H01L 21/31144 (2013.01); G03F 7/039 (2013.01); G03F 7/11 (2013.01); G03F 7/16 (2013.01); G03F 7/2004 (2013.01); G03F 7/322 (2013.01); H01L 21/31116 (2013.01); H01L 21/76802 (2013.01); H01L 21/76832 (2013.01)

(58) Field of Classification Search
CPC .................................................... H01L 21/311
See application file for complete search history.

(56) References Cited

U.S. PATENT DOCUMENTS

| | | | |
|---|---|---|---|
| 6,605,229 | B2 | 8/2003 | Steiner et al. |
| 7,037,738 | B2 | 5/2006 | Sugiyama et al. |
| 2008/0038467 | A1 | 2/2008 | Jagannathan et al. |
| 2009/0214823 | A1 | 8/2009 | Cheng et al. |
| 2010/0297847 | A1 | 11/2010 | Cheng et al. |

FOREIGN PATENT DOCUMENTS

| | | |
|---|---|---|
| JP | 2002-519728 A | 7/2002 |
| JP | 2003-218383 A | 7/2003 |
| JP | 2008-149447 A | 7/2008 |
| JP | 2010-58403 A | 3/2010 |

*Primary Examiner* — Marvin Payen
(74) *Attorney, Agent, or Firm* — Oblon, McClelland, Maier & Neustadt, L.L.P.

(57) ABSTRACT

A pattern-forming method includes forming a base pattern having recessed portions on a front face side of a substrate. A first composition is applied on lateral faces of the recessed portions of the base pattern, to form a coating. The first composition includes a first polymer which includes on at least one end of a main chain thereof a group capable of interacting with the base pattern. A surface of the coating is contacted with a highly polar solvent. The recessed portions are filled with a second composition. The second composition includes a second polymer which is capable of forming a phase separation structure through directed self-assembly. Phase separation is permitted in the second composition to form phases. A part of the phases is removed to form a miniaturized pattern. The substrate is etched directly or indirectly using the miniaturized pattern as a mask.

5 Claims, 2 Drawing Sheets

PATTERN-FORMING METHOD

BACKGROUND OF THE INVENTION

Field of the Invention

The present invention relates to a pattern-forming method.

Discussion of the Background

In these days, microfabrication of various types of electronic device structures such as semiconductor devices and liquid crystal devices has been accompanied by demands for miniaturization of patterns in lithography processes. To meet such demands, methods have been proposed in which a finer pattern is formed by using a phase separation structure formed through directed self-assembly of: a block copolymer produced by copolymerization of a first monomer having one property, and a second monomer having a property distinct from that of the first monomer; or a plurality of polymers having each different properties (see, Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383, US Patent Application, Publication No. 2009/0214823 and Japanese Unexamined Patent Application, Publication No. 2010-58403).

By way of use of any one of such methods, a method has been contemplated in which after a composition containing a at least one type of polymer capable of forming a phase separation structure through directed self-assembly is applied on a film having a formed hole pattern, a concentrically cylindrical phase separation structure is formed, followed by removing a central phase of the phase separation structure, whereby a contact hole pattern is formed having a hole diameter smaller than that of the hole pattern (see US Patent Application, Publication No. 2010/0297847).

SUMMARY OF THE INVENTION

According to one aspect of the present invention, a pattern-forming method includes forming a base pattern having recessed portions on a front face side of a substrate directly or via other layer. A first composition is applied on lateral faces of the recessed portions of the base pattern, to form a coating. The first composition includes a first polymer and a solvent. The first polymer includes on at least one end of a main chain thereof a group capable of interacting with the base pattern. A surface of the coating is contacted with a highly polar solvent. The recessed portions are filled, after the contacting of the highly polar solvent, with a second composition. The second composition includes a second polymer and a solvent. The second polymer is capable of forming a phase separation structure through directed self-assembly. Phase separation is permitted in the second composition to form phases after the filling of the second composition. A part of the phases is removed, after the phase separation, to form a miniaturized pattern. The substrate is etched directly or indirectly using the miniaturized pattern as a mask.

DESCRIPTION OF THE EMBODIMENTS

According to an embodiment of the invention, a pattern-forming method comprises: forming a base pattern on a front face side of a substrate directly or via other layer (hereinafter, may be also referred to as "base pattern-forming step"); applying on lateral faces of recessed portions of the base pattern, a first composition (hereinafter, may be also referred to as "composition (I)") containing a polymer and a solvent, the polymer having on at least one end of the main chain a group capable of interacting with the base pattern (hereinafter, may be also referred to as "applying step"); contacting a surface of a coating formed by the applying, with a highly polar solvent for a certain time period (hereinafter, may be also referred to as "contacting step"); filling with a second composition, the recessed portions after the contacting (hereinafter, may be also referred to as "composition (II)") containing at least one type of polymer and a solvent, the polymer being capable of forming a phase separation structure through directed self-assembly (hereinafter, may be also referred to as "filling step"); permitting phase separation in a second composition phase after the filling (hereinafter, may be also referred to as "phase separation step"); removing a part of phases after the phase separation to form a miniaturized pattern (hereinafter, may be also referred to as "removing step"); and etching the substrate directly or indirectly using the miniaturized pattern (hereinafter, may be also referred to as "etching step").

The pattern-forming method of the embodiment of the present invention is capable of forming a miniaturized pattern with less roughness, for example, represented by CDU (Critical Dimension Uniformity), and enables a substrate pattern having a desired favorable shape to be obtained by using such a superior miniaturized pattern as a mask. Therefore, the pattern-forming method can be suitably used for working processes of semiconductor devices, and the like, in which microfabrication is expected to be further in progress hereafter.

Hereinafter, embodiments of the present invention will be described in detail. It is to be noted that the present invention is not limited to the following embodiments.

Pattern-Forming Method

The pattern-forming method includes the base pattern-forming step, the applying step, the contacting step, the filling step, the phase separation step, the removing step, and the etching step. In the pattern-forming method, the composition (I) contains a polymer and a solvent, the polymer having on at least one end of the main chain a group capable of interacting with the base pattern (hereinafter, may be also referred to as "(A) polymer" or "polymer (A)"). Further, the composition (II) contains at least one type of polymer and a solvent, the polymer being capable of forming a phase separation structure through directed self-assembly (hereinafter, may be also referred to as "(B) polymer" or "polymer (B)"). Hereinafter, each step will be described.

Base Pattern-Forming Step

In this step, a base pattern is formed on a front face side of a substrate directly or via other layer.

Figure 1:
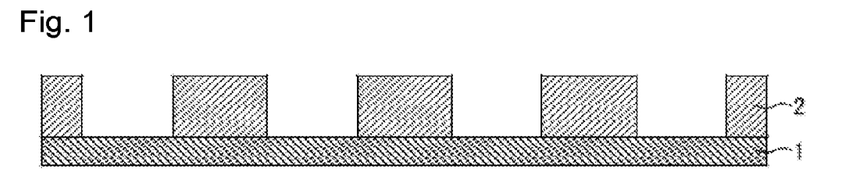
FIG. 1 shows a schematic cross sectional view illustrating one example of the state after forming a base pattern on the front face side of a substrate.

In this step, a base pattern is formed on a front face side of a substrate directly or via other layer. The base pattern 2 may be directly formed on a front face of a substrate 1 as shown in FIG. 1, or may be formed via other layer by, for example, forming an underlayer film, a spin-on glass (SOG) film and/or a resist film on the front face (front face side) of the substrate, and then forming the base pattern 2 on the front face side (a face side not facing the substrate 1) of these films on the substrate 1. Of these procedures, in light of possible formation of the pattern in a more convenient manner on the substrate by etching using as a mask the resist pattern formed, it is preferred that the base pattern is directly formed on the front face side of the substrate.

The base pattern 2 interacts with a group (I) which is comprised at an end of the main chain of the polymer (A) contained in the composition (I) described later. As the base pattern that interacts with the group (I) of the polymer (A) in this manner, for example, polymers and the like having a group that interacts with the group (I) may be exemplified. As the group that interacts with the polymer (A), for example, a hydroxy group, a carboxy group, a carbonyl group, and the like may be exemplified. In the case of the base pattern 2 being formed by etching from a polymer having a carbon atom as described later, a hydroxy group, a carboxy group, a carbonyl group and the like may be generally contained in the base pattern.

In the case of the base pattern 2 being formed from a polymer, the polymer is not particularly limited as long as it interacts with the polymer (A), and in light of an improvement of etching resistance, preferably includes as a principal component a polymer having an aromatic ring (hereinafter, may be also referred to as "polymer (P)"). The "principal component" as referred to means a component whose proportion is the largest, preferably no less than 50% by mass and more preferably no less than 70%.

As the polymer (P), for example, a novolak polymer, a resol polymer, a styrene polymer, an acenaphthylene polymer, a calixarene polymer, a pyrene polymer and the like may be exemplified.

The lower limit of the proportion of the aromatic ring in the polymer (P) is preferably 50% by mass, more preferably 60% by mass, and still more preferably 70% by mass. The upper limit of the proportion is preferably 99% by mass, and more preferably 95% by mass.

Procedure of Base Pattern Formation

According to an exemplary procedure of directly forming the base pattern 2 on a front face of the substrate 1, for example, after directly forming the underlayer film on the front face of the substrate 1, a hole pattern is formed on the underlayer film. In this procedure, more specifically, the underlayer film is formed on the front face of the substrate 1 by using a composition for underlayer film formation. Next, as needed, an SOG film may be formed on the face side not facing the substrate 1 of the underlayer film on the substrate 1 by using an SOG composition. The resist film is formed on the front face of the underlayer film or the SOG film on the substrate 1 by using a resist composition. Then, this resist film is exposed and developed, whereby a resist film pattern is formed. By using this resist film pattern as a mask, the SOG film and/or the underlayer film are/is sequentially etched. The etching procedure may involve dry etching in which a gas mixture of $CF_4/O_2$/Air, $N_2/O_2$, etc., is used; wet etching in which an aqueous hydrofluoric acid solution, etc., is used; or the like. Of these, in light of more favorable transfer of the shape to be executed and possibility of formation of a greater number of groups that are capable of interacting with the polymer (A) in the polymer constituting the base pattern, the dry etching is preferred. When the underlayer film and the SOG film are sequentially dry-etched, it is preferred that the SOG film remaining on the surface of the resulting underlayer film pattern is detached away by using an aqueous hydrofluoric acid solution or the like. Accordingly, the base pattern 2 directly formed on the front face of the substrate 1 is obtained.

As the substrate 1, for example, a silicon substrate such as a silicon (Bare-Si) wafer, and a conventional known substrate such as an aluminum-coated wafer may be used. Of these, the silicon substrate is preferred and the silicon wafer is more preferred.

As the composition for underlayer film formation, a conventionally known organic underlayer film-forming material or the like may be used, and for example, a composition for underlayer film formation containing a crosslinking agent and the like may be exemplified.

The forming procedure of the underlayer film is not particularly limited, and, for example, a process in which after applying a composition for underlayer film formation on the front face of the substrate by a known procedure such as spin coating, followed by prebaking (PB), the resultant surface of the coating is hardened by carrying out irradiation with a radioactive ray and/or heating, and the like may be exemplified. Examples of the radioactive ray for use in irradiation include: electromagnetic waves such as a visible light ray, an ultraviolet ray, a far ultraviolet ray, an X-ray and a γ-ray; particle rays such as electron beam, a molecular beam and an ion beam; and the like. The lower limit of the temperature of the heating is preferably 90° C., more preferably 120° C., and still more preferably 150° C. The upper limit of the temperature of the heating is preferably 550° C. and more preferably 450° C., and a temperature of no higher than 300° C. is even more preferred. The lower limit of the heating time period is preferably 5 sec, more preferably 10 sec, and still more preferably 20 sec. The upper limit of the heating time period is preferably 1,200 sec, more preferably 600 sec, and still more preferably 300 sec. The lower limit of the average thickness of the underlayer film is preferably 10 nm, more preferably 30 nm, and still more preferably 50 nm. The upper limit of the average thickness is preferably 1,000 nm, more preferably 500 nm, and still more preferably 200 nm.

As the SOG composition, a conventionally known SOG composition or the like may be used, and for example, a composition containing organic polysiloxane, and the like may be exemplified.

The forming procedure of the SOG film is not particularly limited, and, for example, a process in which after applying an SOG composition on the front face of the substrate or on the face of the underlayer film not facing the substrate by a known procedure such as spin coating, followed by PB, and the resultant coating is hardened by carrying out an irradiation with a radioactive ray and/or heating. Examples of the radioactive ray for use in irradiation include: electromagnetic waves such as a visible light ray, an ultraviolet ray, a far ultraviolet ray, an X-ray and a γ-ray; particle rays such as an electron beam, a molecular beam and an ion beam; and the like. The lower limit of the temperature of the heating is preferably 100° C., more preferably 150° C., and still more preferably 180° C. The upper limit of the temperature of the heating is preferably 450° C., more preferably 400° C., and still more preferably 350° C. The lower limit of the heating time period is preferably 5 sec, more preferably 10 sec, and still more preferably 20 sec. The upper limit of the heating time period is preferably 1,200 sec, more preferably 600 sec, and still more preferably 300 sec. The lower limit of the Average thickness of the SOG film is preferably 10 nm, more preferably 15 nm, and still more preferably 20 nm. The upper limit of the average thickness is preferably 1,000 nm, more preferably 500 nm, and still more preferably 100 nm.

As the resist composition, a conventional resist composition such as, for example, a composition containing a polymer having an acid-labile group, a radiation-sensitive acid generator and a solvent, or the like may be used.

In the procedure of resist film pattern formation, the resist composition is applied onto: a front face of the substrate 1; a face of the underlayer film not facing the substrate 1; or a face of the SOG film not facing the substrate 1, and thereafter PB is carried out, whereby a resist film is formed. Next, an exposure is carried out through a mask pattern for forming the base pattern 2 having a desired shape. Examples of the radioactive ray which may be used for the exposure include electromagnetic waves such as an ultraviolet ray, a far ultraviolet ray, an extreme ultraviolet ray (EUV), and an X-ray; charged particle rays such as an electron beam and an α-ray, and the like. Of these, the far ultraviolet ray is preferred, an ArF excimer laser beam and a KrF excimer laser beam are more preferred, and an ArF excimer laser beam is still more preferred. For the exposure, liquid immersion lithography may be employed. After the exposure, it is preferred that post exposure baking (PEB) is carried out. Then, a development is carried out by using a developer solution, e.g., an alkaline developer solution such as a 2.38% by mass aqueous tetramethylammonium hydroxide solution or an aqueous tetrabutylammonium hydroxide solution, an organic solvent such as butyl acetate or anisole.

The lower limit of the average thickness of the resist film is preferably 10 nm, more preferably 30 nm, and still more preferably 50 nm. The upper limit of the average thickness is preferably 1,000 nm, more preferably 500 nm, and still more preferably 200 nm.

In the case of the base pattern 2 being formed from the polymer (P), it is possible to promote hardening by subjecting to a treatment of, for example, irradiating with an ultraviolet ray of 254 nm, etc., followed by heating at 100° C. or higher and 200° C. or lower for a time period of no less than 1 min and no greater than 30 min.

In addition, the face of the base pattern 2 may be subjected to a hydrophobilization treatment or a hydrophilization treatment. A specific treatment procedure may be exemplified by e.g., a hydrogenation treatment including an exposure to hydrogen plasma for a certain period of time. An increase of the hydrophobicity or hydrophilicity of the face of the base pattern 2 enables coating properties of the composition (I) in the applying step to be further improved.

The shape of the base pattern 2 may be appropriately selected depending on the shape of the formed pattern that the substrate will finally have, and is exemplified by a hole pattern, a line-and-space pattern, and the like. Exemplary shape of the hole pattern in a planar view includes circular (substantially true circular), oval, regular tetragonal, rectangular, hook shaped, trapezoidal, triangular, and the like.

In the case of the base pattern 2 to be formed being a circular hole pattern, the lower limit of the average diameter thereof is preferably 10 nm, more preferably 20 nm, still more preferably 25 nm, and particularly preferably 30 nm. The upper limit of the average diameter is preferably 200 nm, more preferably 100 nm, still more preferably 70 nm, and particularly preferably 50 nm.

Applying Step

In this step, the composition (I) is applied on lateral faces of recessed portions of the base pattern.

The applying procedure of the composition (I) is exemplified by spin coating and the like.

Composition (I)

The composition (I) contains the polymer (A) and a solvent. The composition (I) may contain other component in addition to the polymer (A) and the solvent, within a range not leading to impairment of the effects of the present invention.

(A) Polymer

The polymer (A) has on at least one end of the main chain a group capable of interacting with the base pattern (I). The interaction between the polymer (A) and the base pattern 2 is, in light of further facilitation of overlaying of the polymer (A) onto a lateral face of the base pattern 2: preferably formation of a chemical bond; more preferably formation of a covalent bond, formation of an ionic bond, an electrostatic attractive force between molecules, or formation of a hydrogen bond; still more preferably formation of a covalent bond, or formation of a hydrogen bond; and particularly preferably formation of a covalent bond.

In the case of the base pattern 2 being formed from the polymer (P), and having a hydroxy group and/or a carboxy group, the group (I) that is capable of forming a chemical bond with the polymer (P) is exemplified by a group that includes a hydroxy group, a carboxy group, a sulfanyl group, an epoxy group, a cyano group, a vinyl group and/or a carbonyl group, and the like. Of these, since it is considered to form a covalent bond with a hydroxy group and/or a carboxy group in the polymer (P) under heat, and in light of possibility of a strong interaction, the group (I) is preferably a group that includes a hydroxy group, or a group that includes a carbonyl group, and more preferably a group that includes a hydroxy group.

In the polymer (A), the group (I) may bond to only one end of the main chain, or may bond to both ends of the main chain. The "main chain" as referred to means the longest one of the atom chains of a polymer. Of these, in light of enhancing the interaction with the polymer (P), the group (I) preferably bonds to only one end of the main chain.

Specific examples of the group (I) include groups represented by the following formulae, a 2-hydroxy-3-(2-ethylhexyloxy)propyl group, and the like.

Of these, a group having a hydroxy group is preferred, and a hydroxyethyl group, a hydroxypropyl group and a 2-hydroxy-3-(2-ethylhexyloxy)propyl group are more preferred, and a 2-hydroxy-3-(2-ethylhexyloxy)propyl group is still more preferred.

Examples of the polymer (A) include a styrene polymer, a (meth)acrylic polymer, an ethylene polymer, a copolymer composed of a combination thereof, and the like.

The styrene polymer includes a structural unit derived from substituted or unsubstituted styrene.

Examples of the substituted styrene include α-methylstyrene, o-, m-, p-methylstyrene, p-t-butylstyrene, 2,4,6-trimethyl styrene, p-methoxystyrene, p-t-butoxystyrene, o-, m-, p-vinylstyrene, o-, m-, p-hydroxystyrene, m-, p-chloromethylstyrene, p-chlorostyrene, p-bromostyrene, p-iodostyrene, p-nitrostyrene, p-cyano styrene, and the like.

The (meth)acrylic polymer includes a structural unit derived from a (meth)acrylic acid or a (meth)acrylic acid ester.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid-substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

The ethylene polymer includes a structural unit derived from substituted or unsubstituted ethylene.

Examples of the substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene; vinylglycidyl ether; vinyltrimethylsilyl ether; and the like.

Of these, the styrene polymer is preferred, the polymer that includes a structural unit derived from substituted or unsubstituted styrene is more preferred, and the structural unit is more preferably derived from unsubstituted styrene.

The polymer (A) is: preferably a polymer that has the group (I) on one end of the main chain, and includes a structural unit derived from substituted or unsubstituted styrene; more preferably a polymer that has on one end of the main chain at least one group of a hydroxy group, a carboxy group, a sulfanyl group, an epoxy group, a cyano group, a vinyl group and a carbonyl group and includes a structural unit derived from substituted or unsubstituted styrene, and still more preferably a polymer of unsubstituted styrene that has on at least one end of the main chain at least one group of a hydroxy group, a carboxy group, a sulfanyl group, an epoxy group, a cyano group, a vinyl group and a carbonyl group.

Synthesis Process of Polymer (A)

The polymer (A) may be synthesized by a polymerization process that enables a terminal group to be introduced, such as, for example, living cationic polymerization, living anionic polymerization, living radical polymerization, coordination polymerization (Ziegler-Natta catalyst, metallocene catalyst), or the like. Alternatively, the polymer (A) may be also synthesized by radical polymerization in which a radical polymerization initiator is used having a structure that serves as a terminal group. Of these, in light of easier introduction of a terminal group to be enabled, living anionic polymerization is preferred.

Examples of the anionic polymerization initiator which may be used in the living anionic polymerization include:

alkyl lithium, alkylmagnesium halide, naphthalene sodium alkylated lanthanoid compounds;

potassium alkoxides such as t-butoxy potassium and 18-crown-6-ether potassium;

alkyl zinc such as dimethyl zinc and diethyl zinc;

alkyl aluminum such as trimethyl aluminum;

aromatic metal compounds such as benzyl potassium, cumyl potassium and cumyl cesium. Of these, alkyl lithium is preferred.

Examples of the solvent used in the living anionic polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone, 2-heptanone and cyclohexanone;

ethers such as tetrahydrofuran, dimethoxyethanes and diethoxyethanes; and the like. One, or two or more types of these solvents may be used.

The reaction temperature in the living anionic polymerization may be appropriately selected in accordance with the type of the anionic polymerization initiator, the lower limit of the reaction temperature is preferably −150° C., and more preferably −80° C. The upper limit of the reaction temperature is preferably 50° C., and more preferably 40° C. The lower limit of the reaction time period is preferably 5 min, and more preferably 20 min. The upper limit of the reaction time period is preferably 24 hrs, and more preferably 12 hrs.

The polymer (A) formed by the polymerization is preferably recovered by a reprecipitation technique. More specifically, after completion of the reaction, the reaction liquid is charged into a reprecipitation solvent to recover the intended polymer in a powder form. As the reprecipitation solvent, alcohol, ultra pure water, alkane and the like may be used alone or as a mixture of two or more types thereof. Not only the reprecipitation technique, a liquid separation operation, as well as a column operation, a ultrafiltration operation and the like may be employed to recover the polymer through removing low-molecular weight components such as monomers and oligomers.

The lower limit of the number average molecular weight (Mn) of the polymer (A) is preferably 1,000, more preferably 2,000, still more preferably 3,000, and particularly preferably 4,000. The upper limit of the Mn is preferably 100,000, more preferably 30,000, still more preferably 10,000, and particularly preferably 7,000.

The upper limit of a ratio (dispersity index) of Mw (weight average molecular weight) to Mn of the polymer (A) is preferably 5, more preferably 3, still more preferably 2, and particularly preferably 1.3. The lower limit of the ratio is typically 1, and preferably 1.05.

The Mn and Mw of the polymer herein are determined by gel permeation chromatography (GPC) through using GPC columns (for example: "G2000 HXL"×2; "G3000 HXL"×1; and "G4000 HXL"×1, available from Tosoh Corporation), under analytical conditions involving: the flow rate of 1.0 mL/min; the elution solvent of tetrahydrofuran; sample concentration of 1.0% by mass; the amount of injected sample of 100 μL; and the column temperature of 40° C., with a differential refractometer as a detector, based on mono-dispersed polystyrene as a standard.

The lower limit of the content of the polymer (A), with respect to the total solid content in the composition (I), is preferably 80% by mass, more preferably 90% by mass, and still more preferably 95% by mass. The upper limit of the content is, for example, 100% by mass. The "total solid content" as referred to means the total of the components other than the solvent in the composition (I).

Solvent

The solvent is not particularly limited as long as it can dissolve or disperse at least the polymer (A) and other component(s).

The solvent is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol and tert-butanol;

polyhydric alcohol solvents such as ethylene glycol, 1,2-propylene glycol and 1,3-butylene glycol;

polyhydric alcohol partially etherated solvents such as ethylene glycol monomethyl ether, ethylene glycol monoethyl ether and ethylene glycol monopropyl ether; and the like.

Examples of the ether solvent include:

dialkyl ether solvents such as diethyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone and methyl ethyl ketone;

cyclic ketone solvents such as cyclopentanone and cyclohexanone; and the like.

Examples of the amide solvent include:

cyclic amide solvents such as N,N'-dimethylimidazolidinone and N-methylpyrrolidone;

chain amide solvents such as N-methylformamide and N,N-dimethylformamide; and the like.

Examples of the ester solvent include:

acetic acid ester solvents such as methyl acetate and ethyl acetate;

polyhydric alcohol partially etherated carboxylate solvents such as ethylene glycol monomethyl ether acetate, diethylene glycol monomethyl ether acetate, propylene glycol monomethyl ether acetate (PGMEA) and propylene glycol monomethyl ether propionate;

lactone solvents such as γ-butyrolactone and valerolactone;

carbonate solvents such as ethylene carbonate and propylene carbonate;

lactic acid ester solvents such as methyl lactate and ethyl lactate; and the like.

Examples of the hydrocarbon solvent include:

aliphatic hydrocarbon solvents such n-pentane and methylcyclohexane;

aromatic hydrocarbon solvents such as benzene and toluene; and the like.

Of these, the ester solvent is preferred, the polyhydric alcohol partially etherated carboxylate solvent is more preferred, and PGMEA is still more preferred. composition (I) may contain one, or two or types of the solvent.

Other Component

The other component in the composition (I) is exemplified by a surfactant, and the like. When the composition (I) contains the surfactant, the application property onto the base pattern 2 may be improved.

Preparation Method of Composition (I)

The composition (I) may be prepared by, for example, mixing the polymer (A), the solvent, and as needed the other component(s) at a predetermined ratio, and preferably filtering the resulting mixture through a membrane filter having a polar size of about 200 nm, etc. The lower limit of the solid content concentration of the composition (I) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Figure 2:
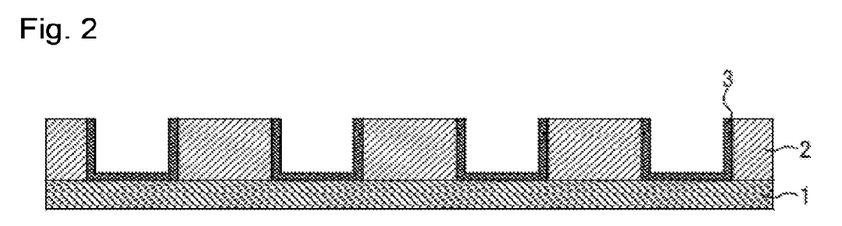
FIG. 2 shows a schematic cross sectional view illustrating one example of the state after applying the composition (I) on lateral faces of recessed portions of the base pattern shown in FIG. 1.

The lower limit of the average thickness of thus formed coating 3 is preferably 1 nm, more preferably 5 nm, and still more preferably 10 nm. The upper limit of the average thickness is preferably 50 nm, more preferably 40 nm, and still more preferably 30 nm.

Contacting Step

Figure 3:
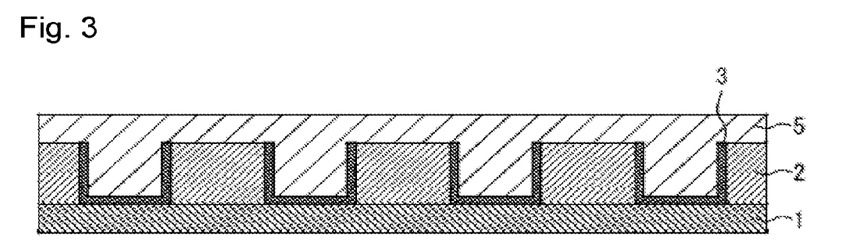
FIG. 3 shows a schematic cross sectional view illustrating one example of the state after contacting a surface of a coating shown in FIG. 2 with a highly polar solvent.
Figure 4:
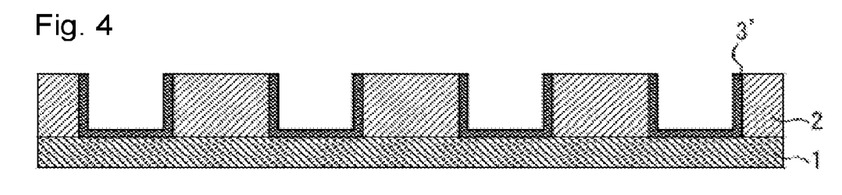
FIG. 4 shows a schematic cross sectional view illustrating one example of the state after removing the highly polar solvent from the surface of the coating shown in FIG. 3.

In this step, a surface of a coating formed by the applying is contacted with a highly polar solvent for a certain time period. In this step, more specifically, a surface of a coating 3 is brought into contact with a highly polar solvent 5 as shown in FIG. 3, and then as shown in FIG. 4, the highly polar solvent 5 is removed from the surface of the coating to give a coating 3' after contacting with a solvent, whereby recessed portions to be filled with the composition (II) in the next filling step are secured.

The highly polar solvent may contain a solvent alone, or may also contain a solute other than the solvent within a range not leading to impairment of the effects of the present invention. The solute is exemplified by an alkali metal salt such as sodium chloride, and the like. The upper limit of the concentration of the solute in the highly polar solvent is preferably 20% by mass, more preferably 10% by mass, and still more preferably 5% by mass. The highly polar solvent may contain one or two or more types of the solvent, and one, or two or more types of the solute.

The lower limit of the solubility parameter (hereinafter, may be also referred to as "SP value") of the highly polar solvent is, for example, 10, preferably 11, more preferably 12, still more preferably 13, particularly preferably 14, more particularly preferably 15, and most preferably 18. The upper limit of the SP value is, for example, 30. The SP value is calculated according to a method proposed by Fedors et al. Specifically, the SP value is determined with reference to "POLYMER ENGINEERING AND SCIENCE, 1974, Vol. 14, No. 2, ROBERT F. FEDORS. (pages 147-154)". In addition, the SP value means a physical property value determined according to the content of hydrophobic groups and hydrophilic groups in a molecule, and in the case where a mixed solvent is used, the SP value refers to a value for a mixture.

Examples of the highly polar solvent include:
water;
alcohols such as methanol, ethanol and ethylene glycol;
phenols such as phenol and cresol;
carboxylic acids such as formic acid and acetic acid;
amides such as dimethylformamide and dimethylacetamide; and the like.

Water is exemplified by ion exchanged water, distilled water, pure water, ultra pure water, and the like.

The highly polar solvent is preferably water, an alcohol and a salt-containing water, more preferably water, methanol, ethanol and a salt-containing water, still more preferably water and a salt-containing water, and particularly preferably water.

The procedure of contacting the surface of the coating 3 with the highly polar solvent is not particularly limited, and exemplary procedures include: dipping the substrate 1 having been provided with the coating 3 in the highly polar solvent for a given time period; placing the highly polar solvent to form a puddle by way of the surface tension on the surface of the substrate 1 having been provided with the coating 3 for a given time period; spraying the highly polar solvent onto the surface of the substrate 1 having been provided with the coating 3; continuously applying the highly polar solvent onto the substrate 1 having been provided with the coating 3 that is rotated at a constant speed while scanning with a nozzle for highly polar solvent application at a constant speed, and the like.

The lower limit of the time period of the contacting of the coating with the highly polar solvent is preferably 10 sec, more preferably 30 sec, still more preferably 1 min, even more preferably 3 min, and particularly preferably 6 min. The upper limit of the time period is preferably 24 hrs, more preferably 6 hrs, still more preferably 1 hour, and particularly preferably 30 min.

The upper limit of the temperature of the highly polar solvent to be in contact is preferably 80° C., more preferably 50° C., and still more preferably 40° C. The lower limit of the temperature is, for example, 0° C., and preferably 5° C.

As a procedure of removing the highly polar solvent from the surface of the coating 3' after contacting with a solvent, for example, evaporation of the highly polar solvent by heat or vacuum, spin-drying by a spin coater method, and the like may be involved.

After removing the highly polar solvent, the coating 3' after contacting with a solvent is preferably heated. The heating means may be exemplified by an oven, a hot plate and the like. The lower limit of the heating temperature is preferably 80° C., more preferably 100° C., and still more preferably 150° C. The upper limit of the heating temperature is preferably 400° C., more preferably 350° C., and still more preferably 300° C. The lower limit of the heating time period is preferably 10 sec, more preferably 1 min, still more preferably 5 min, and particularly preferably 10 min. The upper limit of the heating time period is preferably 120 min, more preferably 60 min, still more preferably 40 min, and particularly preferably 30 min.

In addition, the coating 3' after contacting with a solvent is preferably washed with a solvent or the like. Examples of the solvent for use in the washing include those exemplified as the solvent which may be contained in the composition (I), and the like. Of these, the polyhydric alcohol partially etherated carboxylate solvent is preferred, and PGMEA is more preferred.

The lower limit of the average thickness of the coating 3' after contacting with a solvent is preferably 0.1 nm, more preferably 0.5 nm, still more preferably 1 nm, and particularly preferably 2 nm. The upper limit of the average thickness is preferably 50 nm, more preferably 45 nm, still more preferably 40 nm, and particularly preferably 35 nm.

Filling Step

Figure 5:
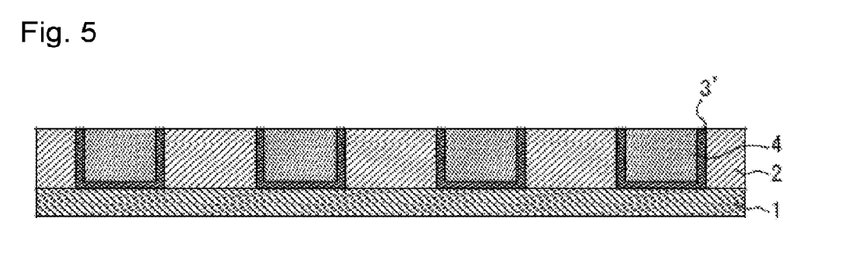
FIG. 5 shows a schematic cross sectional view illustrating one example of the state after filling the recessed portions with the composition (II), subsequent to the contacting step shown in FIG. 4.

In this step, the recessed portions subsequent to the contacting step are filled with the composition (II). Accordingly, as shown in FIG. 5, the recessed portions of the base pattern are each filled with a phase of the solid content contained in the composition (II) to provide a composition (II) phase 4.

The filling procedure with the composition (II) is exemplified by spin coating, and the like. In the filling step, the composition (II) is preferably subjected to PB. The average height of the composition (II) phase 4 is not particularly limited, and is preferably equivalent to the average height of the base pattern 2.

Composition (II)

The composition (II) contains the polymer (B) and a solvent. The composition (II) may contain other component in addition to the polymer (B) and the solvent, within a range not leading to impairment of the effects of the present invention.

(B) Polymer

The polymer (B) is at least one type of polymer capable of forming a phase separation structure through directed self-assembly. The polymer (B) is exemplified by one type of block copolymer (hereinafter, may be also referred to as "(B1) block copolymer" or "block copolymer (B1)"), a mixture of a plurality of types of polymers (hereinafter, may be also referred to as "(B2) block copolymer" or "block copolymer (B2)"), and the like.

(B1) Block Copolymer

The block copolymer (B1) is a polymer constituted from a plurality of types of blocks. Monomers constituting each block are different from each other. When the block copolymer (B1) including such a plurality of blocks is dissolved in an appropriate solvent, the same type of blocks are aggregated, and thus phases each configured with the same type of the blocks are formed. In this process, it is presumed that a phase separation structure having an ordered pattern in which different types of phases are periodically and alternately repeated can be formed since the phases formed with different types of the blocks are unlikely to be admixed with each other.

The block constituting the block copolymer (B1) is exemplified by a poly(meth)acrylate block, a polystyrene block, a polyvinyl acetal block, a polyurethane block, a polyurea block, a polyimide block, a polyamide block, an epoxy block, a novolak-type phenol block, a polyester block, and the like. In light of the possibility of forming a finer miniaturized pattern, the block copolymer (B1) is preferably a block copolymer that includes a polystyrene block and a poly(meth)acrylate block, and more preferably a block copolymer that is constituted with only a polystyrene block and a poly(meth)acrylate block (styrene-(meth)acrylic acid ester block copolymer).

The unit constituting the poly(meth)acrylate block is exemplified by a structural unit derived from a (meth)acrylic acid or a (meth)acrylic acid ester in the polymer (A) described above, and the like.

The unit constituting the polystyrene block is exemplified by a structural unit derived from substituted or unsubstituted styrene in the polymer (A) described above, and the like.

In addition, the block copolymer (B1) may have a linking site between these blocks. The "linking site" as referred to herein is not a block, but a site formed from, for example, 1,1-diphenylethylene, etc.

In a case where the block copolymer (B1) is constituted from only the polystyrene block and the poly(meth)acrylate block, the molar ratio of the styrene unit to the (meth)acrylic acid ester unit in the block copolymer (B1) is preferably no less than no less than 10/90 and no greater than 90/10, more preferably no less than 20/80 and no greater than 80/20, and still more preferably no less than 30/70 and no greater than 70/30.

The block copolymer (B1) is exemplified by a diblock copolymer, a triblock copolymer, a tetrablock copolymer, and the like. Of these, the diblock copolymer and the triblock copolymer are preferred, and the diblock copolymer is more preferred.

Synthesis Process of Block Copolymer (B1)

The block copolymer (B1) may be synthesized through living cationic polymerization, living anionic polymerization, living radical polymerization or the like, and for example, the block copolymer (B1) may be synthesized by linking while polymerizing the polystyrene block, the poly(meth)acrylate block and the other block(s) in a desired order. Of these, living anionic polymerization is preferred.

For example, in a case where the block copolymer (B1) that is a diblock copolymer constituted with the polystyrene block and the poly(meth)acrylate block is to be synthesized, styrene is polymerized first using an anion polymerization initiator in an appropriate solvent to form a polystyrene block. Next, a (meth)acrylic acid ester is similarly added, which is linked to the polystyrene block, whereby a poly(meth)acrylate block is formed. It is to be noted that in regard to the synthesis method of each block, for example, the synthesis can be executed by a process including e.g., adding a solution containing a monomer dropwise into a reaction solvent containing an initiator to permit a polymerization reaction.

A solvent and an initiator which may be used in the polymerization are exemplified by those similar to the solvent and the initiator described to be used in the synthesis of the polymer (A), and the like.

The lower limit of the reaction temperature in the polymerization may be predetermined ad libitum depending on the type of the initiator, and is preferably −150° C. and more preferably −80° C. The upper limit of the reaction temperature is preferably 50° C., and more preferably 40° C. The lower limit of the reaction time period for the polymerization is preferably 5 min, and more preferably 20 min. The upper limit of the reaction time is preferably 24 hrs, and more preferably 12 hrs.

The polymer obtained by the polymerization reaction is preferably recovered by a reprecipitation technique similarly to the polymer (A) described above. The reprecipitation solvent and other procedure which may be employed in recovery of the polymer are also similar to those for the polymer (A) described above.

The upper limit of Mn of the block copolymer (B1) is preferably 100,000, more preferably 80,000, and still more preferably 60,000. On the other hand, the upper limit of the Mn is preferably 5,000, more preferably 8,000, and still more preferably 10,000. When the Mn of the block copolymer (B1) falls within the above-specified range, formation of a finer and favorable miniaturized pattern is enabled.

The upper limit of Mw/Mn of the block copolymer (B1) is typically 5, preferably 3, more preferably 2, still more preferably 1.5, and particularly preferably 1.2. On the other hand, the lower limit of the ratio is 1. When the Mw/Mn falls within such a range, formation of a finer and favorable miniaturized pattern is enabled.

(B2) Polymer

The polymer (B2) is constituted from a plurality of types of polymers, and monomers constituting each polymer are different from each other. When the polymer (B2) including such a plurality of types of polymers is dissolved in an appropriate solvent, the same type of polymers are aggregated, and thus phases each configured with the same type of the polymers are formed. In this process, it is presumed that a phase separation structure having an ordered pattern in which different types of phases are periodically and alternately repeated can be formed since the phases formed with different types of the polymers are unlikely to be admixed with each other.

The polymer constituting the polymer (B2) is exemplified by an acrylic polymer, a styrene polymer, a vinyl acetal polymer, a urethane polymer, a urea polymer, an imide polymer, an amide polymer, a novolak-type phenol polymer, an ester polymer, and the like. It is to be noted that the polymer may be either a homopolymer synthesized from one type of a monomer compound, or a copolymer synthesized from a plurality of types of monomer compounds. The polymer (B2) preferably comprises a styrene polymer and an acrylic polymer, and more preferably includes only a styrene polymer and an acrylic polymer.

In a case where the polymer (B2) includes only a styrene polymer and an acrylic polymer, the ratio of number of moles of the structural unit included in the styrene polymer to number of moles of the structural unit included in the acrylic polymer, in the polymer (B2) is preferably no less than no less than 10/90 and no greater than 90/10, more preferably no less than 20/80 and no greater than 80/20, and still more preferably no less than 30/70 and no greater than 70/30. When the molar ratio of the structural unit included in the styrene polymer to the structural unit included in the acrylic polymer, in the polymer (B2) falls within the above range, formation of a finer and favorable miniaturized pattern is enabled.

Synthesis Process of Polymer (B2)

The polymer (B2) may be produced, for example, through polymerization of a monomer corresponding to each predetermined structural unit by using a polymerization initiator such as a radical polymerization initiator, in an appropriate polymerization reaction solvent.

The upper limit of Mn of each polymer in the polymer (B2) is preferably 50,000, more preferably 30,000, still more preferably 20,000, and particularly preferably 15,000. The lower limit of the Mn is preferably 3,000, more preferably 5,000, still more preferably 7,000, and particularly preferably 8,000. When the Mn falls within the above range, obtaining a finer miniaturized pattern is enabled.

The upper limit of Mw/Mn of each polymer in the polymer (B2) is typically 5, preferably 3, and more preferably 2. The lower limit of the Mw/Mn is 1.

The lower limit of the content of the polymer (B) in the composition (II) with respect to the total solid content in the composition (II) (the total of the components other than the solvent) is preferably 80% by mass, more preferably 90% by mass, and still more preferably 95% by mass. The composition (II) may contain one, or two or more types of the polymer (B), and preferably contains one type of the polymer (B).

Phase Separation Step

Figure 6:
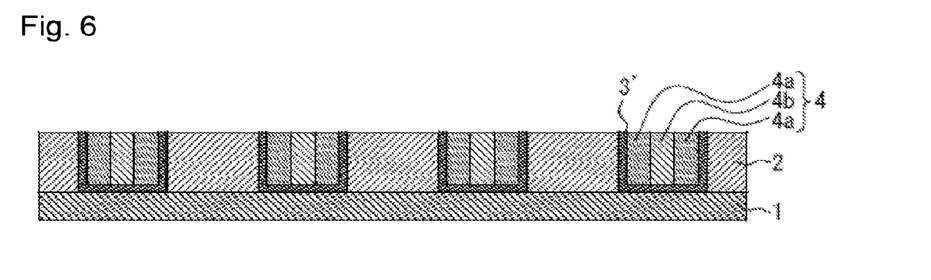
FIG. 6 shows a schematic cross sectional view illustrating one example of the state after permitting phase separation in a composition (II) phase subsequent to the filling step shown in FIG. 5.

In this step, phase separation in the composition (II) phase subsequent to the filling step is permitted. For example, in the case of the polymer (B) being the block copolymer (B1), which is a diblock polymer, by permitting phase separation in the composition (II) phase 4 as shown in FIG. 6, block (a) phase 4a constituted from one type of blocks, and block ((3) phase 4b constituted from another type of blocks are formed.

The procedure for permitting phase separation is exemplified by an annealing process, and the like. The annealing process may include, for example, heating with an oven, a hot plate, etc., and the like. The lower limit of the heating temperature is preferably 80° C., more preferably 100° C., and still more preferably 150° C. The upper limit of the temperature is preferably 400° C., more preferably 350° C., and still more preferably 300° C. The lower limit of the heating time period is preferably 10 sec, more preferably 20 sec, and still more preferably 20 sec. The upper limit of the time period is preferably 120 min, more preferably 10 min, and still more preferably 5 min.

Removing Step

Figure 7:
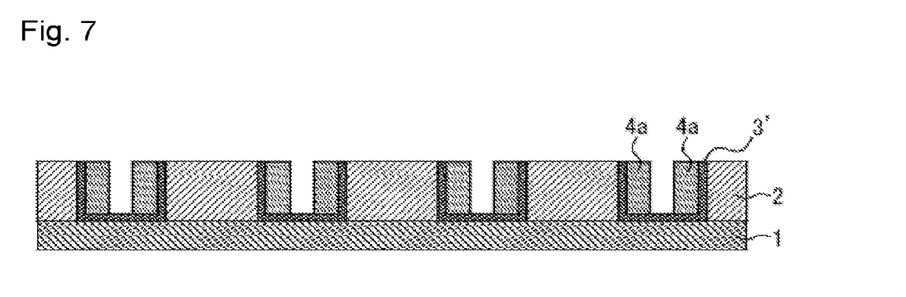
FIG. 7 shows a schematic cross sectional view illustrating one example of the state after removing a part of phases subsequent to the phase separation step shown in FIG. 6.

In this step, a part of phases subsequent to the phase separation step is removed. As shown in FIG. 6, by removing the block (3) phase 4b at the central site among the phases formed through phase separation in the composition (II) phase 4, a miniaturized pattern in which the diameter is smaller than that of the base pattern 2 is formed.

Etching Step

In this step, the substrate is etched by directly or indirectly using the miniaturized pattern formed by the removing step. In this step, the substrate is etched by one or a plurality of etching operations through using the miniaturized pattern that includes: the base pattern 2; the coating 3' after contacting with a solvent; and the block (a) phase 4a. The substrate pattern is formed through this step. The substrate pattern is exemplified by contact holes, and the like. The etching operation is carried out once in a case in which the base pattern 2 was directly formed on the front face side of the substrate 1 in the overlaying step. Whereas, in a case in which the base pattern was formed via other layer on the front face side of the substrate 1, the other layer is etched, and then the other layer after the etching is used as the mask for the etching operations carried out a plurality of times.

The etching procedure is exemplified by known techniques including: reactive ion etching (RIE) such as chemical dry etching carried out using $CF_4$, an $O_2$ gas or the like by utilizing the difference in etching rate of each phase, etc., as well as chemical wet etching (wet development) carried out by using an etching liquid such as an organic solvent or hydrofluoric acid; physical etching such as sputtering etching and ion beam etching. Of these, the reactive ion etching is preferred, and the chemical dry etching and the chemical wet etching are more preferred.

Prior to the chemical dry etching, an irradiation with a radioactive ray may be also carried out as needed. As the radioactive ray, when the phase to be removed by etching is a methyl polymethacrylate block phase, a radioactive ray of 172 nm or the like may be used. The irradiation with such a radioactive ray results in degradation of the methyl polymethacrylate block phase, whereby the etching is facilitated.

Examples of the organic solvent for use in the chemical wet etching include:

alkanes such as n-pentane, n-hexane and n-heptane;

cycloalkanes such as cyclohexane, cycloheptane and cyclooctane;

saturated carboxylic acid esters such as ethyl acetate, n-butyl acetate, i-butyl acetate and methyl propionate;

ketones such as acetone, methyl ethyl ketone, methyl isobutyl ketone and methyl n-pentyl ketone;

alcohols such as methanol, ethanol, 1-propanol, 2-propanol and 4-methyl-2-pentanol; and the like. These solvents may be used either alone, or two or more types thereof may be used in combination.

After completion of the patterning onto the substrate, the phase used as a mask is removed from the front face side of the substrate by a dissolving treatment or the like, whereby a substrate having the formed pattern can be finally obtained. The substrate obtained according to the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to these Examples. Measuring method for each physical property value is shown below.

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 μL;

column temperature: 40° C.;

detector: differential refractometer; and standard substance: mono-dispersed polystyrene.

$^{13}$C-NMR Analysis $^{13}$C-NMR analysis was carried out using a nuclear magnetic resonance apparatus ("JNM-EX400" available from JEOL, Ltd.), with DMSO-$d_6$ for use as a solvent for measurement. The proportion of each structural unit in the polymer was calculated from an area ratio of a peak corresponding to each structural unit on the spectrum obtained by the $^{13}$C-NMR.

Synthesis of Polymers

Synthesis of Polymer (A)

Synthesis Example 1: Synthesis of Polymer (A-1)

After a 500 mL flask as a reaction vessel was dried under reduced pressure, 120 g of tetrahydrofuran (THF) which had been subjected to a distillation dehydrating treatment in a nitrogen atmosphere was charged, and cooled to −78° C. Thereafter, 3.10 mL (3.00 mmol) of a 1 N cyclohexane solution of sec-butyllithium (sec-BuLi) was charged into this THF, and then 16.6 mL (0.150 mol) of styrene which had been subjected to: adsorptive filtration by means of silica gel for removing the polymerization inhibitor; and a dehydration treatment by distillation was added dropwise over 30 min. The polymerization system color was ascertained to be orange. During the instillation, the internal temperature of the polymerization reaction mixture was carefully controlled so as not to be −60° C. or higher. After completion of the dropwise addition, aging was permitted for 30 min. Subsequently, a mixture of 1 mL of methanol and 0.63 mL (3.00 mmol) of 2-ethylhexyl glycidyl ether as a chain-end terminator was charged to conduct a terminating reaction of the polymerization end. The temperature of the polymerization reaction mixture was elevated to the room temperature, and the mixture was concentrated. Thereafter, substitution with methyl isobutyl ketone (MIBK) was carried out. Thereafter, 1,000 g of a 2% by mass aqueous oxalic acid solution was charged and then the mixture was stirred. After leaving to stand, the aqueous underlayer was removed. This operation was repeated three times to remove the Li salt. Thereafter, 1,000 g of ultra pure water was charged and the mixture was stirred. After the mixture was left to stand, the aqueous underlayer was removed. This operation was repeated three times to remove oxalic acid, and then the resulting solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 14.8 g of a polymer represented by the following formula (A-2) as a white solid. This polymer (A-1) had the Mn of 5,000, and the Mw/Mn of 1.07.

(A-1)

Synthesis of Polymer (B)

Synthesis Example 2: Synthesis of Polymer (B-1)

After a 500-mL flask as a reaction vessel was dried under reduced pressure, 200 g of THF which had been subjected to a distillation dehydrating treatment in a nitrogen atmosphere was charged, and cooled to −78° C. Thereafter, 0.30 mL (0.27 mmol) of a 1 N cyclohexane solution of sec-BuLi was charged to this THF, and then 7.3 g (70 mmol) of styrene which had been subjected to: adsorptive filtration by means of silica gel for removing the polymerization inhibitor; and a dehydration treatment by distillation was added dropwise over 30 min. The polymerization system color was ascertained to be orange. During the instillation, the internal temperature of the polymerization reaction mixture was carefully controlled so as not to be −60° C. or higher. After completion of the dropwise addition, aging was permitted for 30 min. Thereafter, 0.11 mL (0.81 mmol) of 1,1-diphenylethylene, and 1.08 mL (0.5 mmol) of a 0.5 N THF solution of lithium chloride were added thereto, and the polymerization system color was ascertained to be dark red. Furthermore, 8.4 g (84 mmol) of methyl methacrylate which had been subjected to: adsorptive filtration by means of silica gel for removing the polymerization inhibitor; and a dehydration treatment by distillation was added dropwise to the polymerization reaction mixture over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the polymerization reaction mixture was elevated to the room temperature, and the mixture was concentrated. Thereafter, substitution with MIBK was carried out. Thereafter, 1,000 g of a 2% by mass aqueous oxalic acid solution was charged and then the mixture was stirred. After leaving to stand, the aqueous underlayer was removed. This operation was repeated three times to remove the Li salt. Thereafter, 1,000 g of ultra pure water was charged and the mixture was stirred. After the mixture was left to stand, the aqueous underlayer was removed. This operation was repeated three times to remove oxalic acid, and then the solution was concentrated. Subsequently, the concentrate was added dropwise into 500 g of methanol to allow the polymer to be precipitated. The solid was collected on a Buechner funnel. Next, in order to remove the polystyrene homopolymer, 500 g of heptane was poured and the polymer was washed, such that the polystyrene homopolymer was dissolved into heptane. This operation was repeated four times, and again the solid was collected on a Buechner funnel. Thus obtained polymer was dried under reduced pressure at 60° C. to give 14.6 g of a polymer (B-1) having white color. This polymer (B-1) had the Mn of 57,000, and the Mw/Mn of 1.04. In addition, as a result of the $^1$H-NMR analysis, the polymer (B-1) was revealed to be a diblock copolymer in which the proportions of the structural unit derived from styrene, and of the structural unit derived from methyl methacrylate were 46.0 mol % and 54.0 mol %, respectively.

Synthesis Example 3: Synthesis of Polymer (B-2)

After a 500-mL flask as a reaction vessel was dried under reduced pressure, 200 g of THF which had been subjected to a distillation dehydrating treatment in a nitrogen atmosphere was charged, and cooled to −78° C. Thereafter, 0.30 mL (0.27 mmol) of a 1 N cyclohexane solution of sec-BuLi was charged to this THF, and then 6.1 g (59 mmol) of styrene which had been subjected to: adsorptive filtration by means of silica gel for removing the polymerization inhibitor; and a dehydration treatment by distillation was added dropwise over 30 min. The polymerization system color was ascertained to be orange. During the instillation, the internal temperature of the polymerization reaction mixture was carefully controlled so as not to be −60° C. or higher. After completion of the dropwise addition, aging was permitted for 30 min. Thereafter, 0.11 mL (0.81 mmol) of 1,1-diphenylethylene, and 1.08 mL (0.5 mmol) of a 0.5 N THF solution of lithium chloride were added thereto, and the polymerization system color was ascertained to be dark red. Furthermore, 7.0 g (70 mmol) of methyl methacrylate which had been subjected to: adsorptive filtration by means of silica gel for removing the polymerization inhibitor; and a dehydration treatment by distillation was added dropwise to the polymerization reaction mixture over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the polymerization reaction mixture was elevated to the room temperature, and the mixture was concentrated. Thereafter, substitution with MIBK was carried out. Thereafter, 1,000 g of a 2% by mass aqueous oxalic acid solution was charged and then the mixture was stirred. After leaving to stand, the aqueous underlayer was removed. This operation was repeated three times to remove the Li salt. Thereafter, 1,000 g of ultra pure water was charged and the mixture was stirred. After the mixture was left to stand, the aqueous underlayer was removed. This operation was repeated three times to remove oxalic acid, and then the solution was concentrated. Subsequently, the concentrate was added dropwise into 500 g of methanol to allow the polymer to be precipitated. The solid was collected on a Buechner funnel. Next, in order to remove the polystyrene homopolymer, 500 g of heptane was poured and the polymer was washed, such that the polystyrene homopolymer was dissolved into heptane. This operation was repeated four times, and again the solid was collected on a Buechner funnel. Thus obtained polymer was dried under reduced pressure at 60° C. to give 11.9 g of a polymer (B-2) having white color. This polymer (B-2) had the Mn of 48,000, and the Mw/Mn of 1.05. In addition, as a result of the $^1$H-NMR analysis, the polymer (B-2) was revealed to be a diblock copolymer in which the proportions of the structural unit derived from styrene, and of the structural unit derived from methyl methacrylate were 46.5 mol % and 53.5 mol %, respectively.

Preparation of Composition

The polymer (A), the polymer (B) and the solvent (C) used in the preparation of the composition (I) and the composition (II) are shown below.

(A) Polymer

A-1: polymer synthesized in Synthesis Example 1 (Mn=5,000, Mw/M=1.07)

A-2: ω-hydroxy-terminated polystyrene (manufactured by Polymer Source Inc., Sample#: P18902-SOH; Mn=19,500, Mw/Mn=1.09)

(B) Polymer

B-1: polymer synthesized in Synthesis Example 2 (Mn=57,000, Mw/Mn=1.04)

B-2: polymer synthesized in Synthesis Example 3 (Mn=48,000, Mw/Mn=1.05)

(C) Solvent

C-1: propylene glycol monomethyl ether acetate

Preparation of Composition (I)

Preparation Example 1

A composition (S-1) was prepared by mixing 100 parts by mass of (A-1) as the polymer (A) and 9,900 parts by mass of (C-1) as the solvent (C), and then filtering the mixed solution thus obtained through a membrane filter having a pore size of 200 nm. The composition (S-1) had a solid content concentration of 1% by mass.

Preparation Example 2

Composition (S-2) was prepared similarly to Preparation Example 1 except that each component of the type and content shown in Table 1 below was used.

TABLE 1

| (parts by mass) Composition (I) | | Preparation Example 1 S-1 | Preparation Example 2 S-2 |
| --- | --- | --- | --- |
| (A) Polymer | A-1 | 100 | |
| | A-2 | | 100 |
| (C) Solvent | C-1 | 9,900 | 9,900 |
| Solid content concentration (% by mass) | | 1 | 1 |

Preparation of Composition (II)

Preparation Example 3

A composition (T-1) was prepared by mixing 100 parts by mass of (B-1) as the polymer (B) and 16,566 parts by mass of (C-1) as the solvent (C), and then filtering the mixed solution thus obtained through a membrane filter having a pore size of 200 nm. The composition (T-1) had a solid content concentration of 0.6% by mass.

Preparation Example 4

Composition (T-2) was prepared similarly to Preparation Example 3 except that each component of the type and content shown in Table 2 below was used.

TABLE 2

| (parts by mass) composition (II) | | Preparation Example 3 T-1 | Preparation Example 4 T-2 |
| --- | --- | --- | --- |
| (B) Polymer | B-1 | 100 | |
| | B-2 | | 100 |
| (C) Solvent | C-1 | 16,566 | 16,566 |
| Solid content concentration (% by mass) | | 0.6 | 0.6 |

Coating Formation, and Contacting with Highly Polar Solvent

Examples 1 and 2, and Comparative Example 1

Base Pattern Formation

An underlayer film having an average thickness of 100 nm was formed on a bare-Si substrate by using a composition for underlayer film formation ("HM710" available from JSR Corporation), and on this underlayer film, an SOG film having an average thickness of 30 nm was formed by using an SOG composition ("ISX302" available from JSR Corporation). On the SOG film thus obtained, a positive tone resist composition ("EUVJ2121" available from JSR Corporation) was applied to form a resist film having a thickness of 50 nm, which was then subjected to an EUV exposure. The resist film was developed using a 2.38% by mass aqueous tetrabutylammonium hydroxide solution to form a contact hole pattern. Next, by using this contact hole pattern as a mask, etching of the SOG film was carried out with a gas mixture of $CF_4/O_2$/air. Then, the underlayer film was etched buy using thus obtained SOG film pattern as a mask with an $N_2/O_2$ gas mixture to form a base pattern having hole shapes with the hole diameter of 49 nm, 47 nm, 45 nm, 42 nm, 39 nm, 36 nm, 34 nm, 33 nm and 31 nm.

Coating Formation, and Contacting with Highly Polar Solvent

Example 1

On the base pattern formed as described above, a coating of (S-1) as the composition (I) was formed, and the substrate having been provided with the coating was dipped in ion exchanged water for 5 min and then picked up from water. Remaining ion exchanged water was removed by nitrogen purging. Subsequently, baking at 200° C. for 20 min, and rinsing with PGMEA gave a contact hole pattern after contacting with a solvent.

Example 2

On the base pattern formed as described above, a coating of (S-1) as the composition (I) was formed, and the substrate having been provided with the coating was dipped in a 5% by mass aqueous sodium chloride solution for 5 min and rinsed with ion exchanged water. Remaining ion exchanged water was removed by nitrogen purging. Subsequently, baking at 200° C. for 20 min, and rinsing with PGMEA gave a contact hole pattern after contacting with a solvent.

Comparative Example 1

On the base pattern formed as described above, a coating of (S-1) as the composition (I) was formed, baked at 200° C. for 20 min and rinsed with PGMEA.

Measurement of Brush Density

A contact hole size was measured on the contact hole pattern after contacting with a solvent obtained as described above with a scanning electron microscope (SEM), and the amount of shrinkage was calculated by subtracting the contact hole size from the base pattern size. A total of the amount of shrinkage in each base pattern was divided by 9 to calculate an average amount of shrinkage. A value derived through dividing the average amount of shrinkage by 2 was regarded as a brush film thickness, and the brush film thickness value was substituted in the following formula (X) to calculate the brush density.

$$\delta = d \times L \times N_A \times 10^{-21}/Mn \quad (X)$$

(σ: brush density (brush number/nm$^2$), d: density of polymer (g/cm$^3$), L: brush film thickness (nm), $N_A$: Avogadro's number (brush number/mol), Mn: number average molecular weight (g/mol))

The results of measurement of the brush density in Examples 1 and 2, and Comparative Example 1 are shown in Table 3 below.

TABLE 3

| | Immersion solvent | Brush density (brush number/nm$^2$) |
|---|---|---|
| Example 1 | ion exchanged water | 0.220 |
| Example 2 | aqueous NaCl solution | 0.230 |
| Comparative Example 1 | — | 0.150 |

Examples 3 and 4, and Comparative Example 2

Base Pattern Formation

An underlayer film having an average thickness of 100 nm was formed on a bare-Si substrate by using a composition for underlayer film formation ("HM710" available from JSR Corporation), and on this underlayer film, an SOG film having an average thickness of 30 nm was formed by using an SOG composition ("ISX302" available from JSR Corporation). On the SOG film thus obtained, a positive tone resist composition ("EUVJ2121" available from JSR Corporation) was applied to form a resist film having a thickness of 50 nm, which was then subjected to an EUV exposure. The resist film was developed using a 2.38% by mass aqueous tetrabutylammonium hydroxide solution to form a contact hole pattern. Next, by using this contact hole pattern as a mask, etching of the SOG film was carried out with a gas mixture of $CF_4/O_2$/Air. Then, the underlayer film was etched buy using thus obtained SOG film pattern as a mask with an $N_2/O_2$ gas mixture to form a base pattern having hole shapes with the hole diameter of 53 nm, 51 nm, 49 nm, 46 nm and 43 nm.

Coating Formation, and Contacting with Highly Polar Solvent

Example 3

On the base pattern formed as described above, a coating of (S-1) as the composition (I) was formed, and ion exchanged water was placed on the coating to form a puddle, followed by leaving to stand for 10 min. Thereafter, remaining ion exchanged water was removed by spin-drying. Subsequently, baking at 200° C. for 20 min, and rinsing with PGMEA gave a contact hole pattern after contacting with a solvent.

Example 4

On the base pattern formed as described above, a coating of (S-1) as the composition (I) was formed, and an aqueous sodium chloride solution was placed on the coating to form a puddle, followed by leaving to stand for 10 min. Then, spinning at a low speed was conducted for 30 sec, while rinsing with ion exchanged water. Thereafter, remaining ion exchanged water was removed by spin-drying. Subsequently, baking at 200° C. for 20 min, and rinsing with PGMEA gave a contact hole pattern after contacting with a solvent.

Comparative Example 2

On the base pattern formed as described above, a coating of (S-1) as the composition (I) was formed, then baked at 200° C. for 20 min and rinsed with PGMEA.

Measurement of Brush Density

In a similar manner to Examples 1 and 2, and Comparative Example 1 described above, the contact hole size was measured with SEM, and the amount of shrinkage was calculated by subtracting the contact hole size from the base pattern size. A total of the amount of shrinkage in each base pattern was divided by 5 to calculate an average amount of shrinkage. A value derived through dividing the average amount of shrinkage by 2 was regarded as a brush film thickness, and the brush film thickness value was substituted in the above formula (X) to calculate the brush density.

The results of measurement of the brush density in Examples 3 and 4, and Comparative Example 2 are shown in Table 4 below.

TABLE 4

| | Immersion solvent | Brush density (brush number/nm$^2$) |
|---|---|---|
| Example 3 | ion exchanged water | 0.157 |
| Example 4 | aqueous NaCl solution | 0.189 |
| Comparative Example 2 | — | 0.122 |

Examples 5 and 6, and Comparative Example 3

Base Pattern Formation

An underlayer film having an average thickness of 100 nm was formed on a bare-Si substrate by using a composition for underlayer film formation ("HM710" available from JSR Corporation), and on this underlayer film, an SOG film having an average thickness of 30 nm was formed by using an SOG composition ("ISX302" available from JSR Corporation). On SOG thus obtained, a positive tone resist composition ("EUVJ2121" available from JSR Corporation) was applied to form a resist film having a thickness of 50 nm, which was then subjected to an EUV exposure. The resist film was developed using a 2.38% by mass aqueous tetrabutylammonium hydroxide solution to form a contact hole pattern. Next, by using this contact hole pattern as a mask, etching of the SOG film was carried out with a gas mixture of $CF_4/O_2$/Air. Then, the underlayer film was etched buy using thus obtained SOG film pattern as a mask with an $N_2/O_2$ gas mixture to form a base pattern having hole shapes with the hole diameter of 53 nm, 51 nm, 49 nm, 46 nm and 43 nm.

Coating Formation, and Contacting with Highly Polar Solvent

Example 5

On the base pattern formed as described above, a coating of (S-2) as the composition (I) was formed, and ion exchanged water was placed on the coating to form a puddle, followed by leaving to stand for 5 min. Thereafter, remaining ion exchanged water was removed by spin-drying. Subsequently, baking at 200° C. for 20 min, and rinsing with PGMEA gave a contact hole pattern after contacting with a solvent.

Example 6

On the base pattern formed as described above, a coating of (S-2) as the composition (I) was formed, and ion exchanged water was placed on the coating to form a puddle, followed by leaving to stand for 10 min. Thereafter, remaining ion exchanged water was removed by spin-drying. Subsequently, baking at 200° C. for 20 min, and rinsing with PGMEA gave a contact hole pattern after contacting with a solvent.

Comparative Example 3

On the base pattern formed as described above, a coating of (S-2) as the composition (I) was formed, then baked at 200° C. for 20 min and rinsed with PGMEA.

In a similar manner to Examples 3 and 4, and Comparative Example 2 described above, the contact hole size was measured, and the amount of shrinkage was calculated. A total of the amount of shrinkage in each base pattern was divided by 5 to calculate an average amount of shrinkage. A value derived through dividing the average amount of shrinkage by 2 was regarded as a brush film thickness, and the brush film thickness value was substituted in the above formula (X) to calculate the brush density.

The results of measurement of the brush density in Examples 5 and 6, and Comparative Example 3 are shown in Table 5 below.

TABLE 5

| | Contact time period with ion exchanged water (min) | Brush density (brush number/nm$^2$) |
|---|---|---|
| Example 5 | 5 | 0.252 |
| Example 6 | 10 | 0.246 |
| Comparative Example 3 | 0 | 0.215 |

Miniaturized Pattern Formation

Examples 7 and 8, and Comparative Example 4

Base Pattern Formation

An underlayer film having an average thickness of 100 nm was formed on a bare-Si substrate by using a composition for underlayer film formation ("HM710" available from JSR Corporation), and on this underlayer film, an SOG film having an average thickness of 30 nm was formed by using an SOG composition ("ISX302" available from JSR Corporation). On the SOG film thus obtained, a positive tone resist composition ("EUVJ2121" available from JSR Corporation) was applied to form a resist film having a thickness of 50 nm, which was then subjected to an EUV exposure. The resist film was developed using a 2.38% by mass aqueous tetrabutylammonium hydroxide solution to form a contact hole pattern. Next, by using this contact hole pattern as a mask, etching of the SOG film was carried out with a gas mixture of $CF_4/O_2$/Air. Then, the underlayer film was etched buy using thus obtained SOG film pattern as a mask with an $N_2/O_2$ gas mixture to form a base pattern having hole shapes with the hole diameter of 42 nm, 39 nm, 36 nm, 34 nm, 33 nm and 30 nm.

Coating Formation, Contacting with Highly Polar Solvent, and Miniaturized Pattern Formation

Example 7

On the base pattern formed as described above, a coating of (S-1) as the composition (I) was formed, and the substrate having been provided with the coating was dipped in ion exchanged water for 5 min and then picked up from water. Remaining ion exchanged water was removed by nitrogen purging. Next, after baking at 200° C. for 20 min and rinsing with PGMEA, (T-2) as the composition (II) was applied onto recessed portions of the base pattern subsequent to the contacting step, whereby the composition (II) phase was provided. After baking at 220° C. for 20 min, the phase constituted from PMMA blocks in the polymer (B-2) was removed with an oxygen gas to thereby form a miniaturized pattern.

Example 8

On the base pattern formed as described above, a coating of (S-1) as the composition (I) was formed, and the substrate having been provided with the coating was dipped in a 5% by mass aqueous sodium chloride solution for 5 min and rinsed with ion exchanged water. Remaining ion exchanged water was removed by nitrogen purging. Next, after baking at 200° C. for 20 min and rinsing with PGMEA, (T-2) as the composition (II) was applied onto recessed portions of the base pattern subsequent to the contacting step, whereby the composition (II) phase was provided. After baking at 220° C. for 20 min, the phase constituted from PMMA blocks in the polymer (B-2) was removed with an oxygen gas to thereby form a miniaturized pattern.

Comparative Example 4

On the base pattern formed as described above, a coating of (S-1) as the composition (I) was formed, then baked at 200° C. for 20 min and rinsed with PGMEA. Subsequently, (T-2) as the composition (II) was applied onto recessed portions of the base pattern, whereby the composition (II) phase was provided. After baking at 220° C. for 20 min, the phase constituted from PMMA blocks in the polymer (B-2) was removed with an oxygen gas to thereby form a miniaturized pattern.

Evaluation of CDU Performance

CDU was measured with SEM on thus formed miniaturized patterns in Examples 7 and 8, and Comparative Example 4 to determine an average value. The results of the evaluations of CDU are shown in Table 6 below.

TABLE 6

|  | Immersion solvent | Composition (II) | CDU (nm) |
|---|---|---|---|
| Example 7 | ion exchanged water | T-2 | 2.07 |
| Example 8 | aqueous NaCl solution |  | 1.99 |
| Comparative Example 4 | — |  | 2.16 |

Example 9

On the base pattern formed as described above, a coating of (S-1) as the composition (I) was formed, and ion exchanged water was placed on the coating to form a puddle, followed by leaving to stand for 5 min. Thereafter, remaining ion exchanged water was removed by spin-drying. Next, after baking at 200° C. for 20 min and rinsing with PGMEA, (T-1) as the composition (II) was applied onto recessed portions of the base pattern subsequent to the contacting step, whereby the composition (II) phase was provided. After baking at 220° C. for 20 min, the phase constituted from PMMA blocks in the polymer (B-1) was removed with an oxygen gas to thereby form a miniaturized pattern.

Example 10

On the base pattern formed as described above, a coating of (S-1) as the composition (I) was formed, and an aqueous sodium chloride solution was placed on the coating to form a puddle, followed by leaving to stand for 10 min. Then, spinning at a low speed was conducted for 30 sec, while rinsing with ion exchanged water. Thereafter, remaining ion exchanged water was removed by spin-drying. Next, after baking at 200° C. for 20 min and rinsing with PGMEA, (T-1) as the composition (II) was applied onto recessed portions of the base pattern subsequent to the contacting step, whereby the composition (II) phase was provided. After baking at 220° C. for 20 min, the phase constituted from PMMA blocks in the polymer (B-1) was removed with an oxygen gas to thereby form a miniaturized pattern.

Comparative Example 5

On the base pattern formed as described above, a coating of (S-1) as the composition (I) was formed, then baked at 200° C. for 20 min and rinsed with PGMEA. Next, (T-1) as the composition (II) was applied onto recessed portions of the base pattern, whereby the composition (II) phase was provided. After baking at 220° C. for 20 min, the phase constituted from PMMA blocks in the polymer (B-1) was removed with an oxygen gas to thereby form a miniaturized pattern.

CDU was measured with SEM on thus formed miniaturized patterns in Examples 9 and 10, and Comparative Example 5 to determine an average value. The results of the evaluations of CDU are shown in Table 7 below.

TABLE 7

|  | Immersion solvent | Composition (II) | CDU (nm) |
|---|---|---|---|
| Example 9 | ion exchanged water | T-1 | 2.41 |
| Example 10 | aqueous NaCl solution |  | 2.33 |
| Comparative Example 5 | — |  | 2.74 |

As is clear from the results shown in Tables 6 and 7, the pattern-forming methods of Examples enabled a miniaturized pattern with small CDU to be formed.

The pattern-forming method of the embodiment of the present invention is capable of forming a miniaturized pattern with less roughness, and enables a desired favorable substrate pattern to be obtained by using such a superior miniaturized pattern as a mask. Therefore, the pattern-forming method can be suitably used for working processes of semiconductor devices, and the like, in which microfabrication is expected to be further in progress hereafter.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
    forming a base pattern having a recessed portions on a front face side of a substrate directly or via other layer;
    applying a first composition on lateral faces of the recessed portions of the base pattern to form a coating, the first composition comprising a first polymer and a solvent, the first polymer comprising on at least one end of a main chain thereof a group capable of interacting with the base pattern;
    contacting a surface of the coating with a highly polar solvent;
    filling the recessed portions, after the contacting of the highly polar solvent, with a second composition comprising a second polymer and a solvent, the second polymer being capable of forming a phase separation structure through directed self-assembly;
    permitting phase separation in the second composition to form phases after the filling of the second composition;
    removing a part of the phases, after the phase separation, to form a miniaturized pattern; and
    etching the substrate directly or indirectly using the miniaturized pattern as a mask.

2. The pattern-forming method according to claim 1, wherein the highly polar solvent is water, methanol or ethanol.

3. The pattern-forming method according to claim 1, wherein the second polymer is a block copolymer.

4. The pattern-forming method according to claim 3, wherein the block copolymer is a styrene-(meth)acrylic acid ester block copolymer.

5. The pattern-forming method according to claim 1, wherein the first polymer comprises a structural unit derived from a substituted or unsubstituted styrene.

* * * * *